United States Patent [19]

Laing

[11] Patent Number: 5,772,791
[45] Date of Patent: Jun. 30, 1998

[54] FLOATING SOLAR POWER PLANT WITH ASYMMETRICAL CONCENTRATORS

[76] Inventor: Johannes Nikolaus Laing, 1253 La Jolla Rancho Rd., La Jolla, Calif. 92037

[21] Appl. No.: 665,241

[22] Filed: Jun. 17, 1996

[30] Foreign Application Priority Data

Jun. 20, 1995 [DE] Germany .................. 195 22 215.6

[51] Int. Cl.⁶ .............................................. H01L 31/052
[52] U.S. Cl. .......................................... 136/246; 136/248
[58] Field of Search .................................. 136/246, 248; 126/563–565, 567–568

[56] References Cited

U.S. PATENT DOCUMENTS 4,350,143  9/1982  Laing et al. ........................ 126/568
5,286,305  2/1994  Laing et al. ........................ 136/246
5,445,177  8/1995  Laing et al. ........................ 136/246

*Primary Examiner*—Aaron Weisstuch

[57] ABSTRACT

A solar power plant consists of a multitude of elongated concentrator channels floating on a layer of water, and being covered by linear lenses, which concentrate the solar rays onto photovoltaic cells. These photovoltaic cells are in good heat conducting contact with one vertical wall-element of the concentrator channels near its deepest point, therefore the wedges of rays are penetrating only a triangular portion of the enclosed space, the remaining triangular portion being used as a passage for ambient air which extracts the stored waste heat of the photovoltaic cells from the water layer. There are mechanical means to turn the concentrator channels around a center bearing in such a way that they run parallel to the direction of the wind.

8 Claims, 4 Drawing Sheets

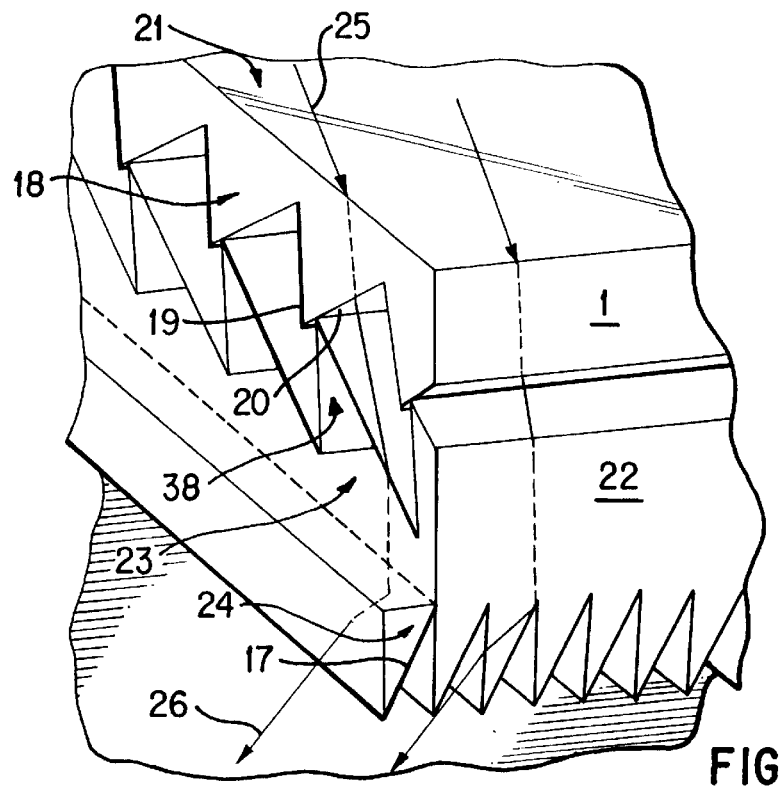
FIG. 3
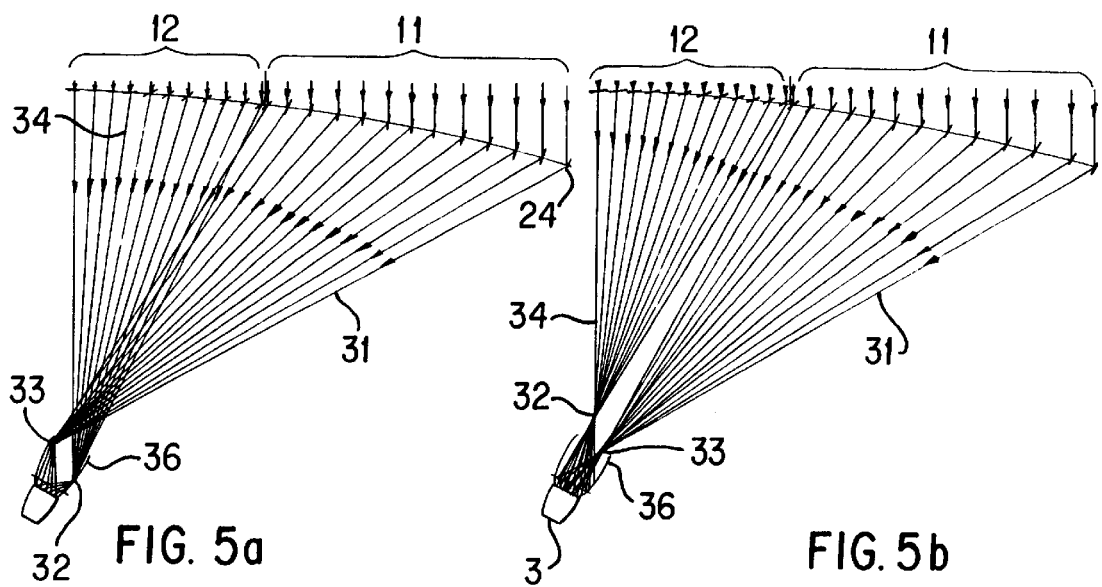
FIG. 5a
FIG. 5b ns patent text

FLOATING SOLAR POWER PLANT WITH ASYMMETRICAL CONCENTRATORS

FIELD OF THE INVENTION

The invention comprises a circular solar platform floating on a shallow layer of water, rotatable about its vertical axis with concentrator channels arranged parallel to each other. The lower surfaces of the channels carry photovoltaic cells extending into the water layer. The concentrator channels are designed in such a way that they enclose air passages which, during hours without sunshine, are positioned in such a way that they run parallel to the direction of the wind.

PRIOR ART

German patent application DE 44 04 295 describes a floating solar power plant in which the concentration of the solar rays is performed by the prisms of a linear lens in which the solar rays undergo an internal reflection. The disadvantage of this design is that the waste heat from the photovoltaic cells, stored in the water layer 9, cannot be sufficiently dissipated to the ambient air.

SUMMARY OF THE INVENTION

The principal idea of the invention consists of air passages through which wind currents can pass. This is achieved by concentrator channels with one almost vertical wall. The lower end of this wall lies below the water level and is in intimate heat conducting contact with the photovoltaic cells. Such a design requires a roof-forming lens with one section comprising the prisms of a Fresnel lens and another section in which the considerable bending of the rays, which cannot be accomplished with Fresnel lenses, is achieved by prisms in which a total reflection of the solar rays takes place.

BRIEF DESCRIPTION OF THE DRAWINGS

FIG. 3 shows the path of rays within the linear lens.

FIG. 5a shows the pencil of rays in one extreme situation.

FIG. 5b shows the pencil of rays in the opposite extreme situation.

DETAILED DESCRIPTION OF THE DRAWINGS

Figure 1:
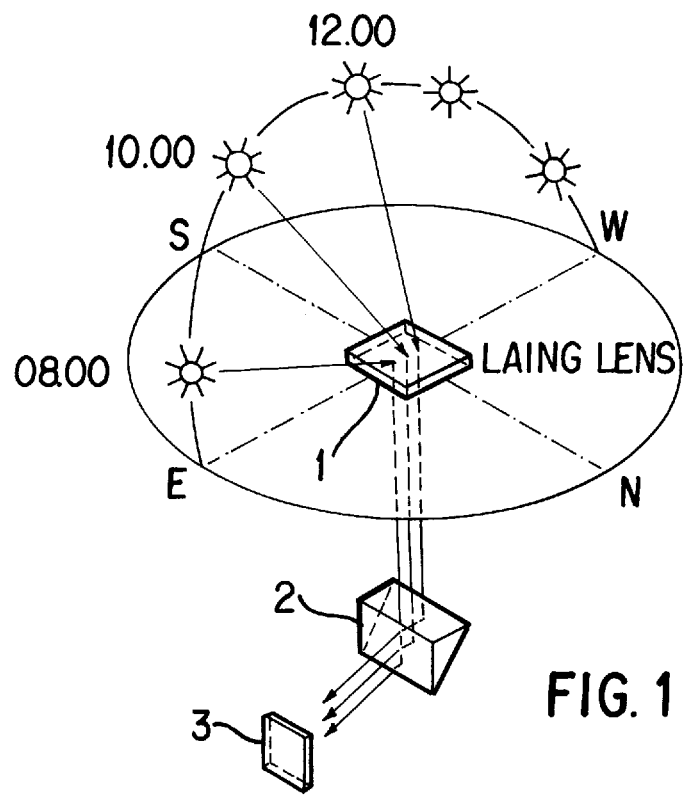
FIG. 1 shows the principle of optical tracking.

FIG. 1 shows the symbolized path of the solar rays being refracted downwards by the upper layer 1, and being concentrated onto the photovoltaic cell 3 by the prism 2 of the second layer.

Figure 2:
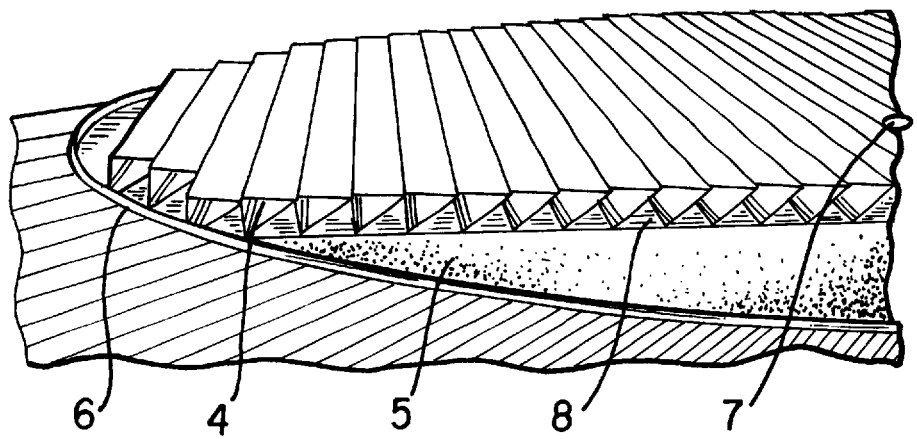
FIG. 2 shows a portion of a solar power plant as described in the invention.

FIG. 2 shows a portion of a floating solar platform in which the elongated concentrator channels 4 are shown in cross section. The water layer 8 is separated from the subsoil by a plastic membrane 5 which is surrounded by a circular wall 6. A central bearing 7 centrally locates the platform floating on the water layer 8. During sunshine hours the platform follows the sun's azimuth; during overcast and night hours a wind sensor causes the platform to turn such that the concentrators run parallel to the direction of the wind.

FIG. 3 shows an enlarged cross-section of the linear lens. The upper layer 1 has a smooth upper surface 21. On its downward-facing side it has steps 18 which are divided into two optical boundary layers 19 and 20. The lower layer 22 has steps 23 on its upward facing boundary face with the same spacing as the steps 18. The edges of steps 23 are in contact with the separating line between the two optical boundary layers 19 and 20. Flanks 38, not penetrated by solar rays, run almost vertical. The downward-facing side of the lower layer 22 has sharply-angled prisms 24 running perpendicular to the steps 18 and 23. These prisms 24 concentrate the solar rays onto focal lines running parallel to prisms 24. Solar rays 25 undergo a total reflection on the right flanks 17 of prisms 24 in the sharply-angled section 11 shown in FIG. 5. From there they exit as rays 26 onto a focal line.

Figure 4A:
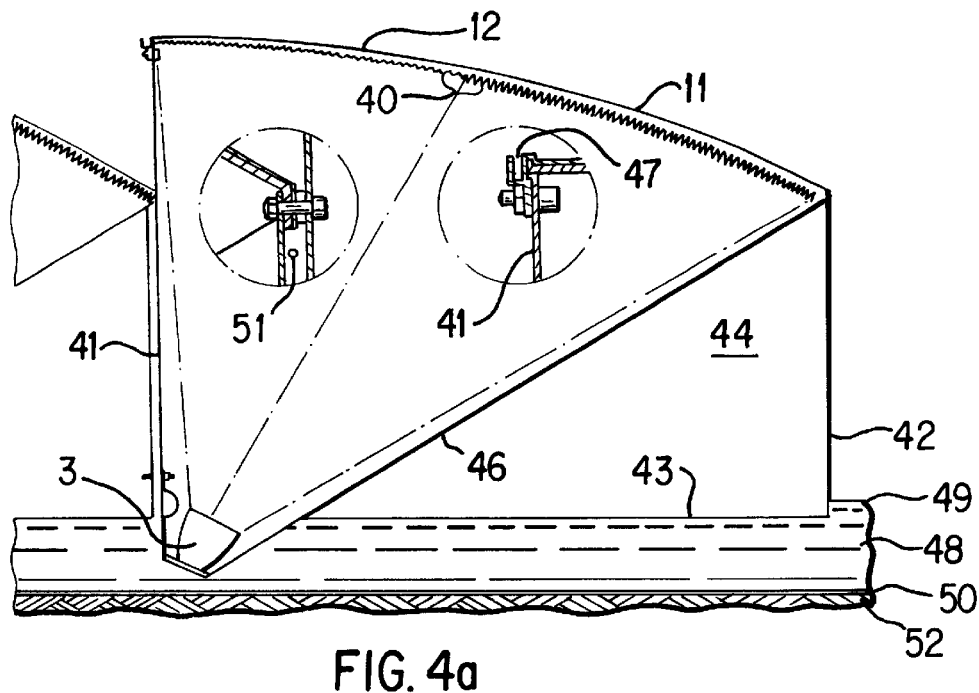
FIG. 4a shows a cross-section through a concentrator channel.

FIG. 4a shows a vertical cross section through concentrator channel 4. The trough 41, 43, 42 whose wall 41 runs vertical, floats on water layer 48, whereby the bottom region 43 is slightly submerged in the water layer. The roof of the concentrator channel 4 is formed by parabolically-bent linear lenses 40. These lenses are divided into two sections; one section 11 has sharply-angled prisms which strongly bend the rays, and a second section 12, resembling a Fresnel lens which slightly bends the rays. The remaining triangular channel 44 acts as a wind passage through which the ambient air can flow, thus cooling the water layer 48 in which the waste heat of the photovoltaic cells has been stored. In areas in which the air is relatively free of dust the diagonal wall 46 can be eliminated. Wall 41 has a groove 47 which acts as a rail on which a maintenance cart can be run. Wall 41 and wall 42 form a channel 51 through which rain water can flow down into water layer 48.

Figure 4B:
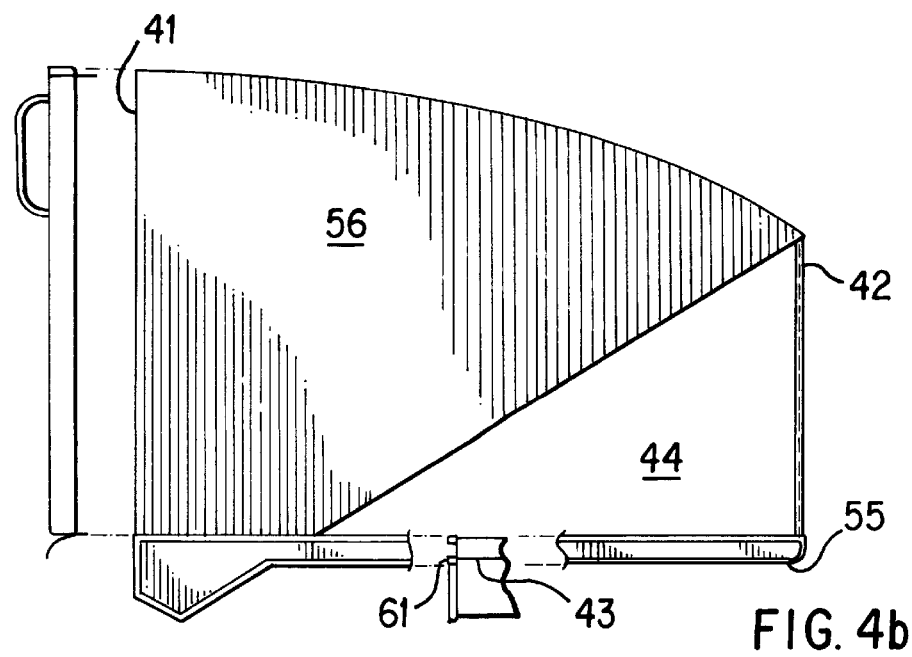
FIG. 4b shows the end-section of a concentrator channel.

FIG. 4b shows the end section of a concentrator channel. The lower wall portion 55 is sealed to the bottom area 43 and the vertically extending wall sections from walls 41 and 42. Above this area a triangular wall 56 is inserted which prevents dust from entering the concentrator channels.

FIG. 5a shows the pencil of rays 31 formed by the strongly-bending section 11 when the sun's elevation is centrally located between the highest and the lowest elevation. The focal line 33 of the pencil of rays 31 then lies above focal line 32 of the pencil of rays 34 which is formed by the Fresnel prisms in section 12.

FIG. 5b shows that the focal lines 32 and 33 for the lowest useable elevation and the maximum elevation have changed places compared to the situation described in FIG. 5a.

Figure 6:
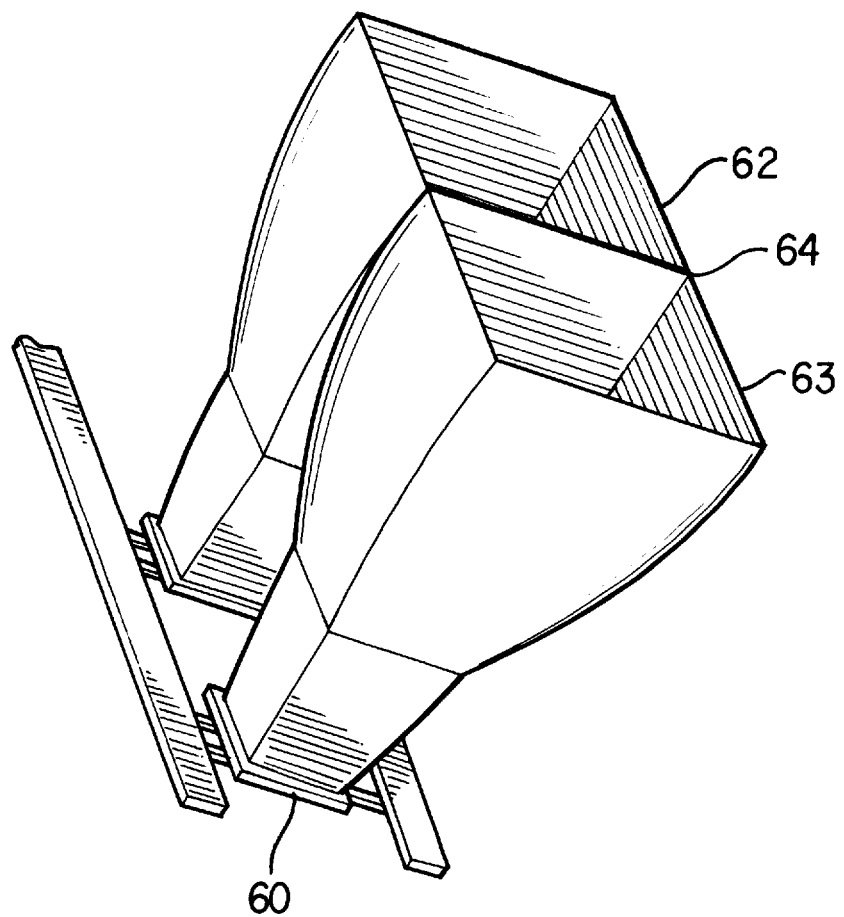
FIG. 6 shows a row of secondary concentrators.

FIG. 6 shows a secondary concentrator system to increase the concentration on the photovoltaic cells 60. These secondary concentrators 62 and 63 concentrate three-dimensionally, in the plane of the drawing as well as in the plane perpendicular to it. This minimizes the necessary surface of photovoltaic cells (60) as well as the cost of the cells. This reduction is possible because the waste heat of the photovoltaic cells (60) is dissipated through the metal wall of the troughs into the water layer (48). The secondary concentrators (62 and 63) are in contact with each other along line (64) so that the total concentrated radiation will reach the photovoltaic cells (60).

I claim:

1. A solar power plant consisting of a circular platform rotatable about a vertical axis, floating on a layer of water (48), the platform comprising a plurality of elongated concentrator channels (4), each concentrator channel (4) being covered with linear lenses (40), a turning device being provided which turns the platform during sunshine hours so that the concentrator channels (4) point to the azimuth of the sun, whereby each concentrator channel (4) comprises a trough-like structure having a wall portion (41) oriented almost vertically, photovoltaic cells (3, 60) targeted by the concentrated solar rays (31, 34) are arranged in close proximity to the lower end of said vertical wall portion (41), and a passage of triangular cross-section (44) remains through which ambient air airflow.

2. Solar power plant according to claim 1, characterized by mechanical drive means which turn the platform during no-sun hours to such a position, that the concentrator channels run parallel to the direction of the wind.

3. Solar power plant according to claim 1, characterized in that the linear lenses (40) are divided into two sections (11 and 12), wherein a strongly refracting section (11) has prisms (24) whose flanks (17) which are not penetrated by the rays cause total reflection, while a slightly refracting section (12) resembles Fresnel lenses.

4. Solar power plant according to claim 1, characterized by the linear lens (40), consisting of two layers, the upper layer (1) having steps (18) on its lower side, and the lower layer (22) having steps (23) on its upper side running parallel to the steps (18) of the upper layer (1), while steps (24) on its lower side run perpendicular to steps (18).

5. Solar power plant according to claim 1, characterized by concentrator channels (4) which are formed by a trough (41, 43, 42) and a roof element (40), the lower portions of the axial ends of the trough (41, 43, 42) being closed by wall elements (55) so that the trough can float.

6. Solar power plant according to claim 1, characterized by adjacent concentrator channels (4) placed at a small distance (51) from each other forming a channel which allows rain water to flow down into the water layer (48).

7. Solar power plant according to claim 1, characterized by the use of discrete photovoltaic cells (60), each of the cells forming a unit with a secondary concentrator (62, 63), the secondary concentrators abutting each other.

8. Solar power plant according to claim 1, characterized by the vertical wall (41) having a groove (47) which acts as rail on which a maintenance cart can be run.

* * * * *